(12) United States Patent
Yasooka

(10) Patent No.: US 8,222,976 B2
(45) Date of Patent: Jul. 17, 2012

(54) MULTILAYER DIELECTRIC SUBSTRATE AND SEMICONDUCTOR PACKAGE

(75) Inventor: Kousuke Yasooka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 104 days.

(21) Appl. No.: 12/920,125

(22) PCT Filed: Mar. 5, 2009

(86) PCT No.: PCT/JP2009/054194
§ 371 (c)(1),
(2), (4) Date: Aug. 30, 2010

(87) PCT Pub. No.: WO2009/116403
PCT Pub. Date: Sep. 24, 2009

(65) Prior Publication Data
US 2011/0006862 A1    Jan. 13, 2011

(30) Foreign Application Priority Data
Mar. 17, 2008   (JP) .................... 2008-068222

(51) Int. Cl.
*H01L 29/00* (2006.01)
(52) U.S. Cl. .................... 333/247; 333/33; 257/659
(58) Field of Classification Search ............ 333/33, 333/247, 230; 257/659, 528, 536
See application file for complete search history.

(56) References Cited

U.S. PATENT DOCUMENTS

| | | | |
|---|---|---|---|
| 6,239,669 B1 | 5/2001 | Koriyama et al. | |
| 2003/0042993 A1 | 3/2003 | Sayanagi et al. | |
| 2007/0273008 A1 | 11/2007 | Suzuki | |

FOREIGN PATENT DOCUMENTS

| | | |
|---|---|---|
| EP | 1 775 765 A1 | 4/2007 |
| JP | 58-063201 | 4/1983 |
| JP | 8 162559 | 6/1996 |
| JP | 11 112209 | 4/1999 |
| JP | 2001 196500 | 7/2001 |
| JP | 2002 208807 | 7/2002 |
| JP | 2003 78310 | 3/2003 |
| WO | 2006 001389 | 1/2006 |

OTHER PUBLICATIONS

European Search Report issued Apr. 5, 2012 in European Application No. EP 09 72 2246.7.

*Primary Examiner* — Stephen Jones
(74) *Attorney, Agent, or Firm* — Oblon, Spivak, McClelland, Maier & Neustadt, L.L.P.

(57) ABSTRACT

A multilayer dielectric substrate includes a first cavity-resonance suppressing circuit that suppresses cavity resonance of a first signal wave and a second cavity-resonance suppressing circuit that suppresses cavity resonance of a second signal wave, a frequency thereof being different from that of the first signal wave. These cavity-resonance suppressing circuits respectively include openings formed in a surface-layer ground conductor, an impedance transformer with a length of an odd multiple of about ¼ of in-substrate effective wavelength of a signal wave, a tip-short-circuited dielectric transmission line with a length of an odd multiple of about ¼, of in-substrate effective wavelength of a signal wave, a coupling aperture formed in an inner-layer ground conductor, and a resistor formed in the coupling aperture. The multilayer dielectric substrate that suppresses cavity resonance of signal waves of a plurality of frequencies.

20 Claims, 9 Drawing Sheets

MULTILAYER DIELECTRIC SUBSTRATE AND SEMICONDUCTOR PACKAGE

TECHNICAL FIELD

The present invention relates to a multilayer dielectric substrate on which an electromagnetically shielded space (hereinafter, cavity) for mounting a semiconductor device that operates in a high frequency band such as a microwave band or a millimeter wave band is formed, and relates to a semiconductor package.

BACKGROUND ART

In a high frequency package in which a high-frequency semiconductor device that operates in a high frequency band such as a microwave band or a millimeter wave band is mounted, the high-frequency semiconductor device is usually mounted within a cavity that is airtightly and electrically shielded by a cover, a seal ring, and a ground conductor, in view of an environmental resistance and an operational stability.

However, resonance is generated in a frequency band that a size of the cavity determined by a member such as a cover is about ½ or an integer multiple of a free-space propagation wavelength, and thus an operation of the semiconductor device within the cavity and characteristics of transmission lines become unstable. Particularly in a high-frequency semiconductor device that operates in a millimeter wave band (30 gigahertz to 300 gigahertz), the size of the device approximates the size of a propagation wavelength corresponding to a signal frequency. Therefore, it becomes difficult to set the size of the cavity for accommodating the device to be less than ½ of the propagation wavelength corresponding to the signal frequency, and a high-order resonant mode is likely to be generated. Particularly in a millimeter wave radar that operates in a 76-GHz band, its free-space propagation wavelength becomes about 4 millimeters in this frequency band and the size of a cavity required for mounting a plurality of high frequency circuits with a size of 1 to 3-mm square becomes about 10 millimeters. Consequently, cavity resonance is likely to be generated.

Conventionally, to suppress the cavity resonance, the following configuration has been proposed. That is, this configuration includes an opening formed in a surface-layer ground conductor on a substrate within a cavity, an impedance transformer that is electrically connected via the opening to the cavity and has a length of about ¼ of in-substrate effective wavelength of a signal wave, a tip-short-circuited dielectric transmission line with a length of about ¼ of in-substrate effective wavelength of a signal wave, a coupling aperture formed at a part of an inner-layer ground conductor that the impedance transformer is connected to the dielectric transmission line, and a resistor formed in the coupling aperture. In this configuration, the absorption efficiency of electromagnetic waves is improved and thus the cavity resonance is reliably suppressed, thereby stably operates a semiconductor device and transmission lines (see, for example, Patent Document 1).

Patent Document 1: International Publication No. WO06/001389

DISCLOSURE OF INVENTION

Problem to be Solved by the Invention

However, when such a high frequency package is used as a multiplier or a harmonic mixer, signal waves of different frequencies may be outputted from transmission lines. In this case, signal waves of a plurality of frequencies exist within a cavity. Conventionally, the impedance transformer and dielectric transmission lines for suppressing the cavity resonance are provided for only one frequency. With this configuration, although resonance of a target frequency can be suppressed, resonance of frequencies other than the target frequency cannot be suppressed.

The present invention has been achieved in view of the above problems, and an object of the present invention is to provide a multilayer dielectric substrate that can suppress cavity resonance efficiently by a simple structure without increasing costs even when there are signal waves of a plurality of frequencies, and to provide a semiconductor package having the multilayer dielectric substrate.

Means for Solving Problem

In order to solve the above problem, and to attain the above object, in a multilayer dielectric substrate having a cavity formed on a dielectric substrate and in which a semiconductor device is incorporated within the cavity, and in the multilayer dielectric substrate including cavity-resonance suppressing circuit having an opening formed in a surface-layer ground conductor arranged on a dielectric substrate within the cavity; an impedance transformer that is formed in a dielectric substrate, electrically connected via the opening to the cavity, and has a length of an odd multiple of about ¼ of in-substrate effective wavelength of a signal wave; a tip-short-circuited dielectric transmission line that is formed in a dielectric substrate and has a length of an odd multiple of about ¼ of in-substrate effective wavelength of a signal wave; a coupling aperture formed at a part of an inner-layer ground conductor where the impedance transformer is connected to the dielectric transmission line, and a resistor formed in the coupling aperture, the multilayer dielectric substrate according to the present invention includes a first cavity-resonance suppressing circuit that suppresses cavity resonance of a first signal wave; and a second cavity-resonance suppressing circuit that suppresses cavity resonance of a second signal wave of which frequency is different from that of the first signal wave.

According to the first invention, a pseudo state equivalent to an open state without a cover is created by forming a termination waveguide coupled to a cavity to suppress cavity resonance. That is, according to this invention, an opening (an open part of a surface-layer ground conductor) is formed at or around a cavity end of a surface-layer ground conductor on a dielectric substrate, and an impedance transformer with a length of an odd multiple of about ¼ of in-substrate effective wavelength $\lambda g$ of a signal wave is formed in the dielectric substrate beyond the opening. A coupling aperture is formed at a distal end of the impedance transformer, that is, at a position on an inner-layer ground conductor apart from the opening by a length of an odd multiple of about $\lambda g/4$ in a thickness direction of the substrate. A resistor (a printed resistor) is then formed to cover the coupling aperture. A characteristic impedance of the impedance transformer is set to be a value obtained by converting impedances of the resistor and the cavity. Further, a tip-short-circuited dielectric transmission line with a length of an odd multiple of about ¼ of in-substrate effective wavelength $\lambda g$ of a signal wave is formed beyond the coupling aperture, that is, the resistor. An electric field distribution in the coupling aperture is open by a short-circuit load condition of the dielectric transmission line and the resistor is arranged at a point where an electric field is maximized so as to be in parallel to the direction of the electric field. The cavity-resonance suppressing circuit including the impedance transformer and the dielectric transmission line includes a first cavity-resonance suppressing circuit that suppresses cavity resonance of a first signal wave and a second cavity-resonance suppressing circuit that suppresses cavity resonance of a second signal wave, the frequency thereof being different from that of the first signal wave.

EFFECT OF THE INVENTION

According to the first invention, impedance conversion with less reflection from a cavity, that is, a hollow waveguide to a resistance load can be achieved for the first signal wave and the second signal wave, the frequency thereof being different from that of the first signal wave, by the impedance transformer. Further, an electric field is maximized (an open point) at the coupling aperture by the tip-short-circuited dielectric transmission line. Therefore, maximum attenuation and absorption effects of the resistor can be provided in the signal frequency bands mentioned above. Thus, cavity resonance is reliably suppressed for signal waves of two frequencies and stable operations of a semiconductor device and a transmission line can be obtained.

Figure 1:
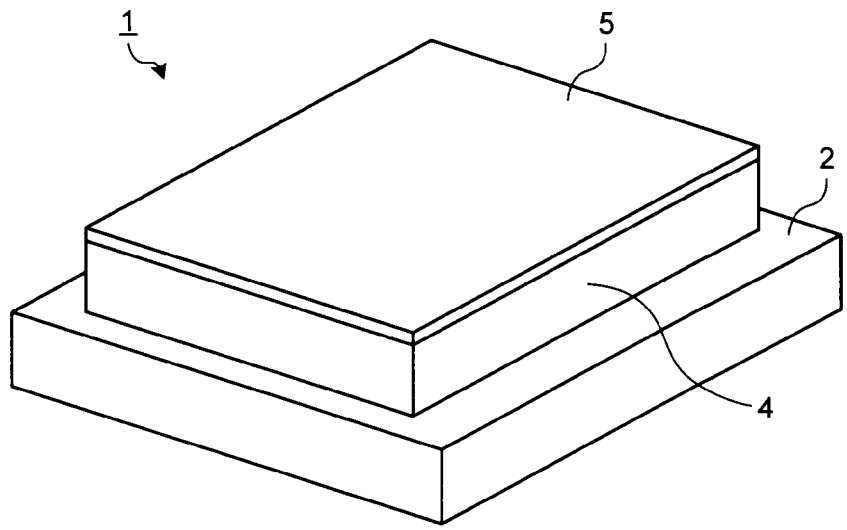
FIG. 1 is a perspective view of an appearance of a semiconductor package (a high frequency package) according to the present invention.

EXPLANATIONS OF LETTERS OR NUMERALS 1 high frequency package (semiconductor package)
2 multilayer dielectric substrate
3A mixer (high frequency device)
3B MMIC (high frequency device)
4 seal ring
5 cover
6 1C mounting recess
6a sidewall
16 ground surface (surface-layer ground conductor)
18 ground pattern (surface-layer ground conductor)
20A, 21A, 22A first cavity-resonance suppressing circuit
20B, 21B, 22B second cavity-resonance suppressing circuit
25, 26, 27 conductive plate
28A first signal-wave transmission line
28B second signal-wave transmission line
30, 30a ground via
30d ground via constituting tip short-circuit surface
30e resistor via array
33 cavity
35 inner-layer ground conductor
40 signal via
50A first opening
50B second opening
60A first impedance transformer
60B second impedance transformer
65A first coupling aperture
65B second coupling aperture
70A first resistor
70B second resistor
80A first dielectric transmission line
80B second dielectric transmission line

BEST MODE(S) FOR CARRYING OUT THE INVENTION

Exemplary embodiments of a multilayer dielectric substrate and a semiconductor package according to the present invention will be explained below in detail with reference to the accompanying drawings. The present invention is not limited to the embodiments.

First Embodiment

Figure 2:
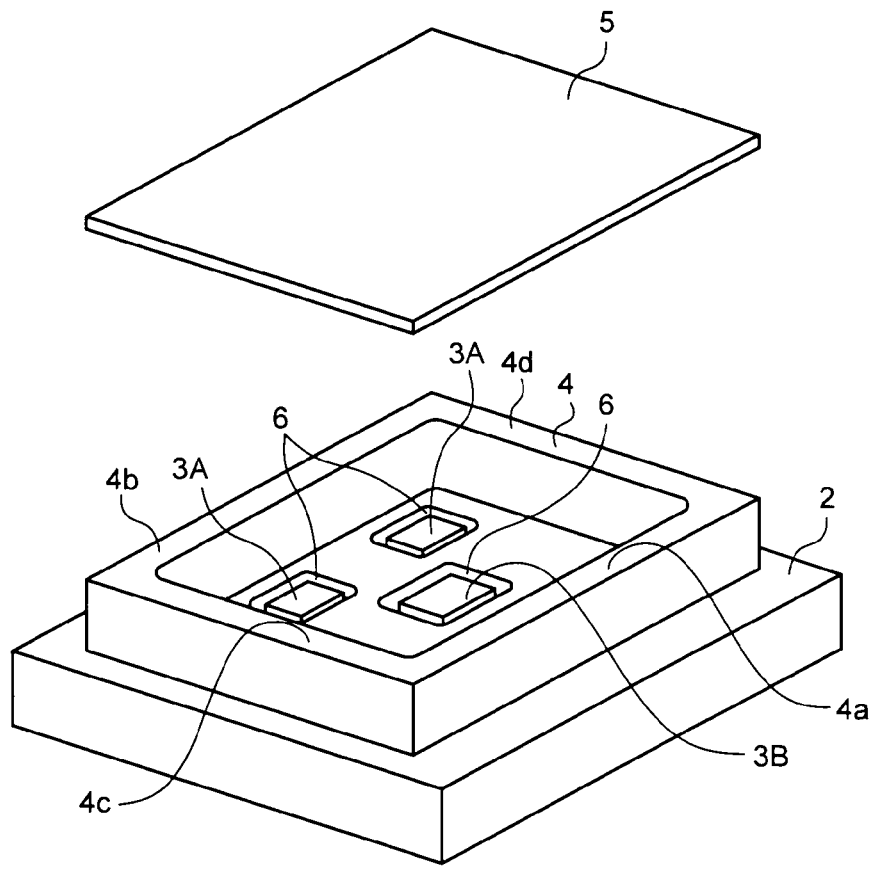
FIG. 2 is a perspective view of an appearance of the semiconductor package according to the present invention with a cover removed.
Figure 3:
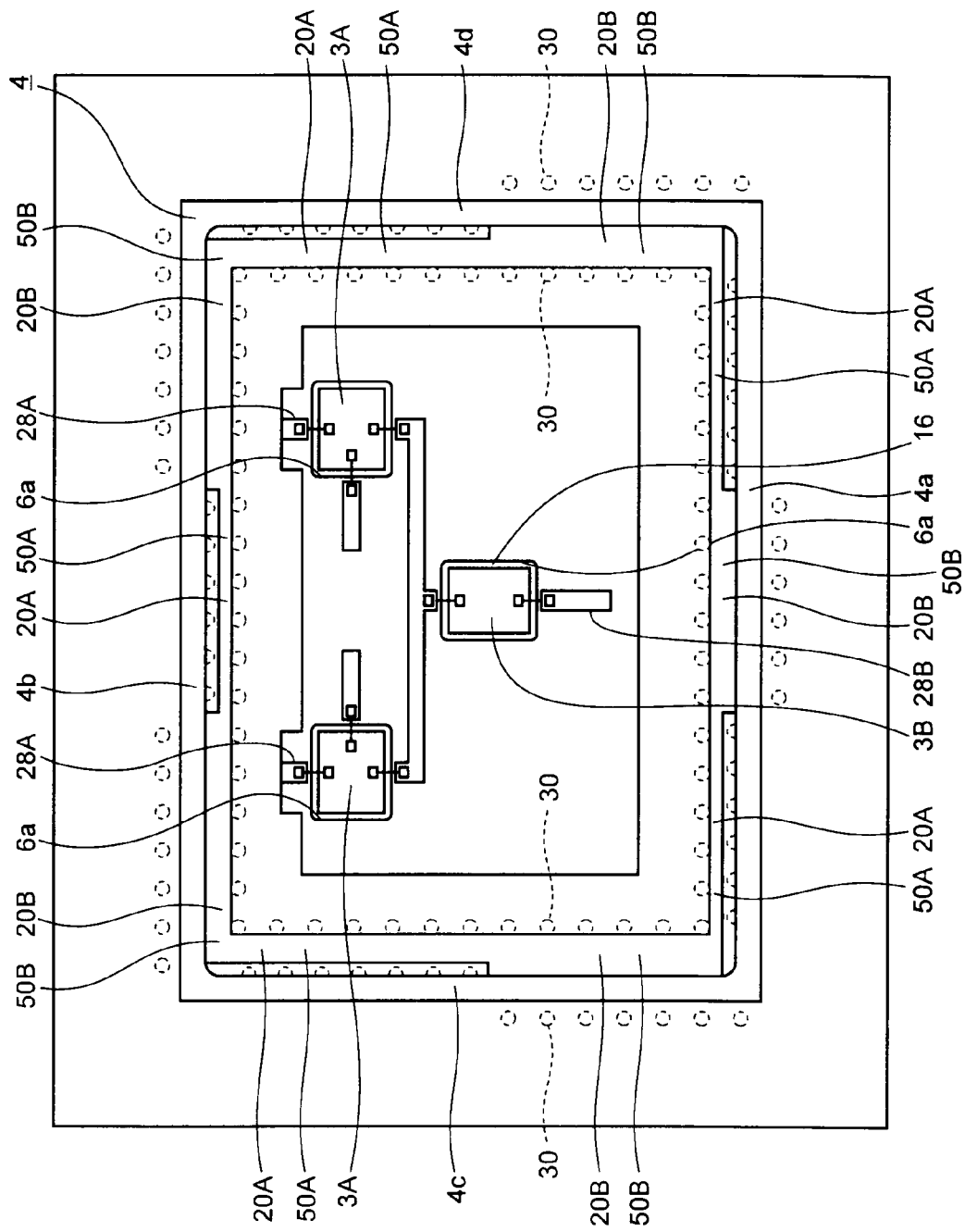
FIG. 3 is a plan view of an internal configuration of the semiconductor package according to the present invention.
Figure 4:
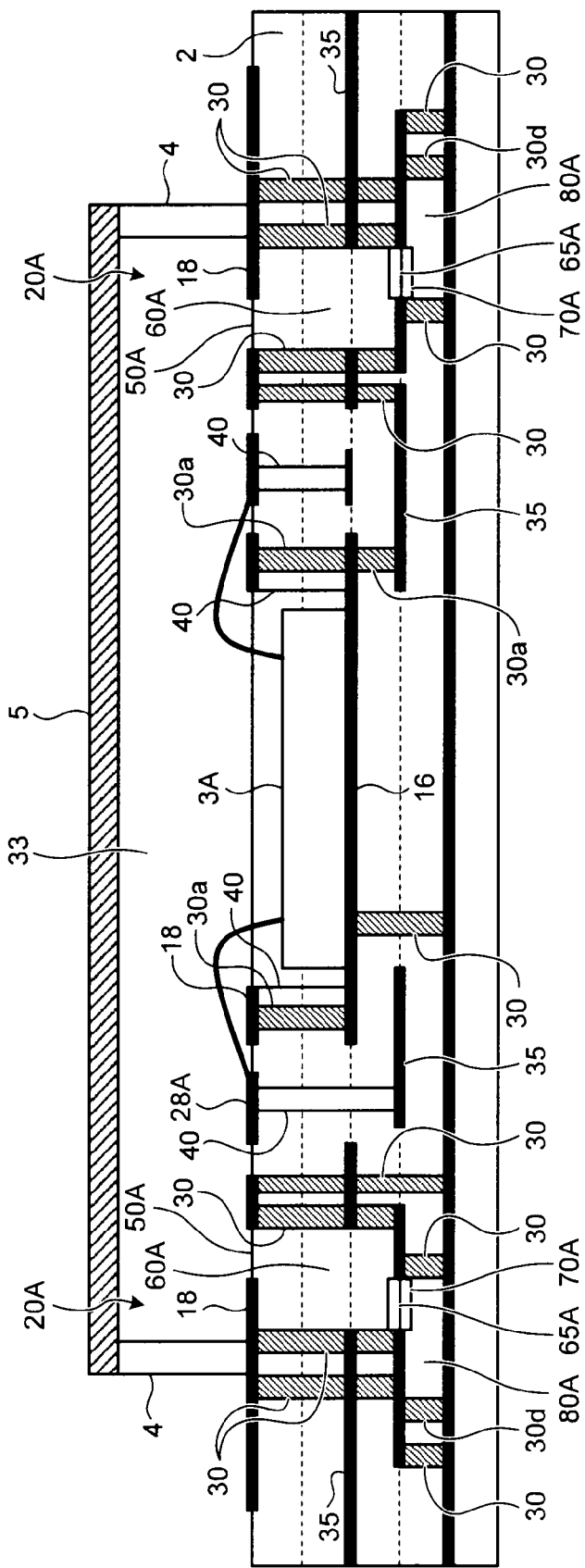
FIG. 4 is a cross-sectional view of an internal hierarchical structure of a multilayer dielectric substrate of the semiconductor package according to a first embodiment, particularly depicting a first cavity-resonance suppressing circuit in detail.
Figure 5:
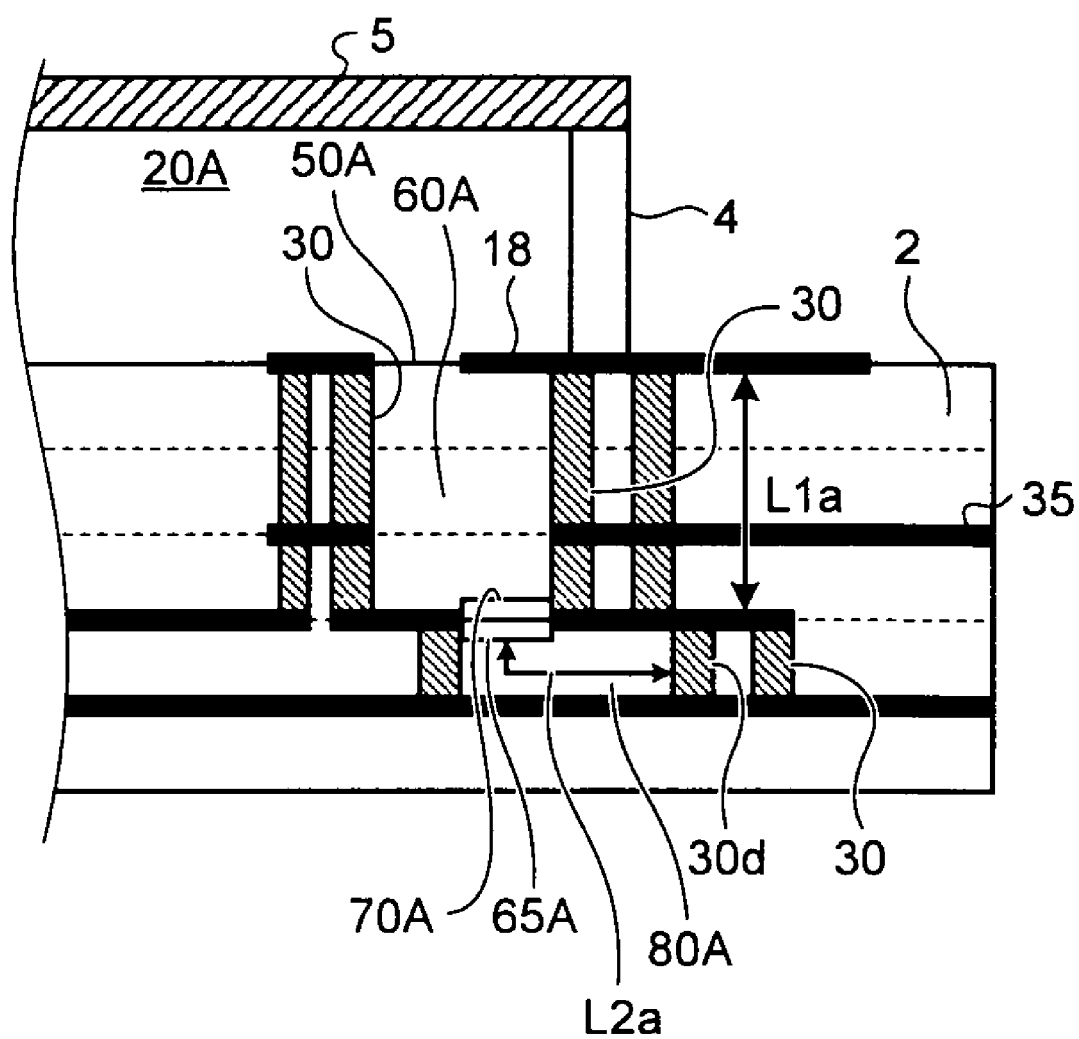
FIG. 5 is a partial enlarged cross-sectional view in which a part of the first cavity-resonance suppressing circuit shown in FIG. 4 is enlarged.
Figure 6:
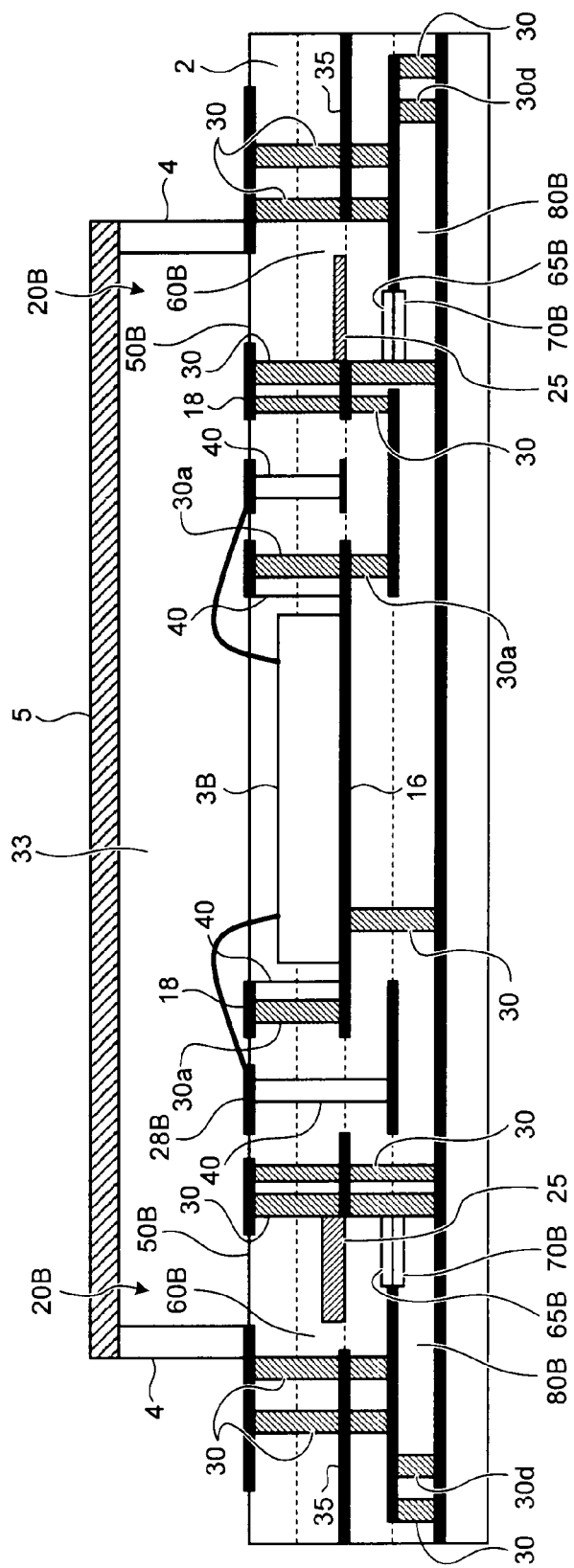
FIG. 6 is a cross-sectional view of an internal hierarchical structure of the multilayer dielectric substrate of the semiconductor package according to the first embodiment, particularly depicting a second cavity-resonance suppressing circuit in detail.
Figure 7:
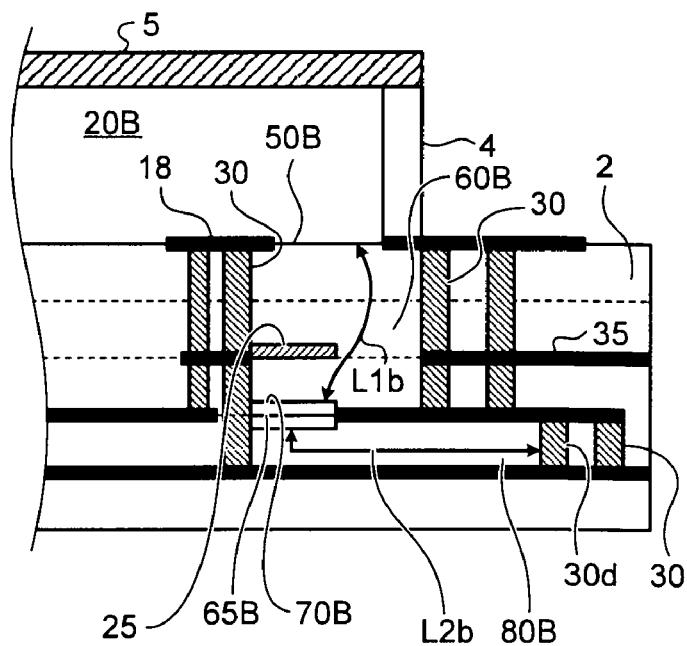
FIG. 7 is a partial enlarged cross-sectional view in which a part of the second cavity-resonance suppressing circuit shown in FIG. 5 is enlarged.

FIG. 1 is a perspective view of an appearance of the semiconductor package (a high frequency package) according to the present invention. FIG. 2 is a perspective view of an appearance of the semiconductor package according to the present invention with a cover removed. FIG. 3 is a plan view of an internal configuration of the semiconductor package according to the present invention. FIG. 4 is a cross-sectional view of an internal hierarchical structure of a multilayer dielectric substrate of the semiconductor package according to a first embodiment. FIG. 5 is a partial enlarged cross-sectional view in which a first cavity-resonance suppressing circuit shown in FIG. 4 is enlarged. FIG. 6 is a cross-sectional view of the internal hierarchical structure of the multilayer dielectric substrate of the semiconductor package according to the first embodiment. FIG. 7 is a partial enlarged cross-sectional view in which a second cavity-resonance suppressing circuit shown in FIG. 5 is enlarged.

While the present invention can be applied to semiconductor packages in which semiconductor devices (semiconductor ICs) that operate in arbitrary frequency bands are mounted, a case of applying the present invention to a semiconductor package 1 in which a plurality of high frequency devices that operate in a high frequency band such as a microwave band or a millimeter wave band are mounted is described here. The semiconductor package 1 is provided with a cavity on a dielectric substrate that is electrically shielded in an airtight or nearly airtight state and a multilayer dielectric substrate 2 for incorporating the high frequency device within the cavity. The nearly airtight state means a state that an electromagnetic shield is configured by making a small hole (a clearance) through which vapor at a height of, for example, 10 micrometers or lower can pass.

A metallic seal ring 4 formed in a rectangular frame shape is bonded on the multilayer dielectric substrate 2 by a brazing material such as solder or silver solder and a cover 5 as a lid is bonded on the seal ring 4 by welding. An MMIC 3B and a mixer 3A that are high frequency devices are incorporated on the multilayer dielectric substrate 2 in the seal ring 4. By bonding the seal ring 4 to the cover 5, the high frequency device on the multilayer dielectric substrate 2 is sealed in an airtight or a nearly airtight state. The seal ring 4 and the cover 5 shield external undesired radiation from the high frequency device. That is, the seal ring 4 and the cover 5 constitute an electromagnetic shield for covering a part of surface layer of the multilayer dielectric substrate 2 and the high frequency device. A configuration of the electromagnetic shield is not particularly limited and various components including ground conductors on the surface of the multilayer dielectric substrate 2 and on inner layers thereof and a plurality of ground vias that are described later are included.

As shown in FIGS. 2 and 3, the MMIC 3B and two mixers 3A connected to the MMIC 3B are incorporated on the multilayer dielectric substrate 2 in the seal ring 4. The MMIC 3B is incorporated in a position closer to one long side 4a of the seal ring 4 from the center of the multilayer dielectric substrate 2. Meanwhile, the two mixers 3A are incorporated in positions closer to another long side 4b of the seal ring 4. The MMIC 3B and the mixers 3A are accommodated in IC mounting recesses 6 formed by drilling upper layers (first and second layers in an example of the drawings) of the multilayer dielectric substrate 2. A ground conductor 16 is formed at a surface of the bottom of the IC mounting recess 6. The MMIC 3B and the mixer 3A are bonded to the ground conductor 16 by a bonding material such as solder or a brazing material.

In FIG. 3, a first signal-wave transmission line 28A for a first signal wave with a frequency of fo extends from each of the two mixers 3A toward the long side 4b. A second signal-wave transmission line 28B for a second signal wave with a frequency of fo/2 extends from the MMIC 3B toward the long side 4a. The first signal-wave transmission line 28A and the second signal-wave transmission line 28B are formed on the surface layer of the multilayer dielectric substrate 2 and wire-bonded by contact pads and wires of the MMIC 3B and the mixer 3A.

A ground conductor 18 on the surface layer of the multilayer dielectric substrate 2 is, as shown in FIGS. 4 and 6, connected to the ground conductor 16 on a surface in which an MMIC is incorporated by a plurality of ground vias 30a (omitted in FIG. 3) around the IC mounting recess 6 in the multilayer dielectric substrate 2, and the ground conductors 18 and 16 have the same potential. Other plural ground vias 30 are arranged along the seal ring 4 and connected to the ground conductor 18, so that their potentials are the same.

A distance between the ground vias 30a and 30 is set to be less than ½ of in-substrate effective wavelength of a high frequency signal which is an undesired wave and used in the high frequency package 1. The undesired wave is thus prevented from entering the multilayer dielectric substrate 2 via a sidewall 6a of the IC mounting recess 6. Further, the ground vias constitute an electromagnetic shield three-dimensionally together with the seal ring 4 described above and the cover 5.

As shown in FIG. 3, two types of a cavity-resonance suppressing circuit, that is, a first cavity-resonance suppressing circuit 20A for a first signal wave with a frequency of fo and a second cavity-resonance suppressing circuit 20B for a second signal wave with a frequency of fo/2 are formed along the seal ring 4. A first opening 50A and a second opening 50B are formed at or around a cavity end of the ground pattern 18 along the seal ring 4. The first cavity-resonance suppressing circuit 20A is formed in the first multilayer dielectric substrate 2 beyond the opening 50A. The second cavity-resonance suppressing circuit 20B is formed in the multilayer dielectric substrate 2 beyond the second opening 50B.

The first cavity-resonance suppressing circuit 20A and the second cavity-resonance suppressing circuit 20B are formed at positions along the seal ring 4 that cavity resonance of the first signal wave with a frequency of fo and of the second signal wave with a frequency of fo/2 can be efficiently suppressed. That is, the first cavity-resonance suppressing circuit 20A is formed at ends of long side 4a of the seal ring 4 as the long side 4a is divided into three, at a central part of the opposing long side 4b as the long side 4b is divided into three, and at parts of two short sides 4c and 4d on the long side 4b side as the short sides 4c and 4d are divided into two. The second cavity-resonance suppressing circuit 20B is formed at remaining parts along the seal ring 4.

In FIGS. 4 and 6, a signal via 40 is shown in solid-white and the ground vias 30 and 30a are hatched. In FIGS. 4 and 5, the first cavity-resonance suppressing circuit 20A is constituted by the first opening 50A, a first impedance transformer 60A, a first coupling aperture 65A, a tip-short-circuited first dielectric transmission line 80A, and a first resistor 70A. In FIGS. 6 and 7, the second cavity-resonance suppressing circuit 20B is constituted by the second opening 50B, a second impedance transformer 60B, a second coupling aperture 65B, a tip-short-circuited second dielectric transmission line 80B, and a second resistor 70B.

The first cavity-resonance suppressing circuit 20A is described with reference to FIGS. 4 and 5. The first opening 50A, that is, a ground open pattern is formed at or around the cavity end of the ground pattern 18 as a surface-layer ground conductor on the surface layer (a first layer) of the multilayer dielectric substrate 2. The first impedance transformer 60A that is electrically connected to a cavity 33 (that is, a hollow waveguide) via the opening 50A and has a length of about ¼ of in-substrate effective wavelength λga of the first signal wave is formed in the multilayer dielectric substrate 2 beyond the first opening 50A. The impedance transformer 60A is constituted by an inner-layer ground conductor 35, a plurality of ground vias 30, and dielectric bodies provided in the inner-layer ground conductor 35 and the ground via 30.

The first coupling aperture 65A, that is, a ground open pattern is formed in the inner-layer ground conductor 35 arranged at a position apart from the first opening 50A by a length of about λga/4 in a thickness direction of the substrate. The first resistor (the printed resistor) 70A is formed to cover the coupling aperture 65A. The tip-short-circuited first dielectric transmission line 80A with a length of about ¼ of in-substrate effective wavelength λga of a signal wave is formed beyond the first coupling aperture 65A. The first dielectric transmission line 80A is constituted by the inner-layer ground conductor 35, the ground vias 30 and 30d, and dielectric bodies provided in the inner-layer ground conductor 35 and the ground via 30 and functions as a dielectric waveguide including a short-circuit surface (a surface on which the ground via 30d is arranged) at its tip. The length about λga/4 in the first dielectric transmission line 80A is a distance L2a from the ground via 30d at the short-circuit tip to the first coupling aperture 65A as shown in FIG. 5. The length about λga/4 in the first impedance transformer 60A is a distance L1a from the first opening 50A to the first coupling aperture 65A.

The first opening 50A is formed at or around the cavity end of the ground pattern 18. The first impedance transformer 60A and the first resistor 70A are connected to the multilayer dielectric substrate 2 beyond the first opening 50A. Because open ends are not realized in waveguides, the first dielectric transmission line 80A is connected to the first impedance transformer 60A and the first resistor 70A is provided at a position apart from a tip short-circuit point of the first dielectric transmission line 80A by about λga/4, that is, at the first coupling aperture 65A as a connecting unit of the first impedance transformer 60A and the first dielectric transmission line 80A. That is, the position apart from the tip short-circuit point of the first dielectric transmission line 80A by about λga/4 is an open point where an electric field is maximized for a signal wave with an in-substrate effective wavelength of λga and the first resistor 70A is provided at this open point. By the configuration described above, the first resistor 70A can operate as a terminator that efficiently attenuates and absorbs in the signal frequency band mentioned above and suppress the cavity resonance for obtaining stable operations of the MMIC and the transmission line.

The second cavity-resonance suppressing circuit 20B is described with reference to FIGS. 6 and 7. The second opening 50B is formed at or around the cavity end of the ground pattern 18. The second impedance transformer 60B with a length of about ¼ of in-substrate effective wavelength λgb of the second signal wave is formed in the multilayer dielectric substrate 2 beyond the second opening 50B.

The second coupling aperture 65B is formed in the inner-layer ground conductor 35 arranged at a position apart from the second opening 50B by a length of about λgb/4 in the thickness direction of the substrate. The second resistor (a printed resistor) 70B is formed to cover the second coupling aperture 65B. Further, the tip-short-circuited second dielectric transmission line 80B with a length of about ¼ of in-substrate effective wavelength λgb of a signal wave is formed beyond the second coupling aperture 65B. The second dielectric transmission line 80B functions as a dielectric waveguide having a short-circuit surface (a surface on which the ground via 30d is arranged) at its tip. The length about λgb/4 in the second dielectric transmission line 80B is a distance L2b from the ground via 30d at the short-circuit tip to the second coupling aperture 65B as shown in FIG. 7. The length about λgb/4 of the second impedance transformer 60B is a distance L1b from the second opening 50B to the second coupling aperture 65B through a conductive plate 25.

The in-substrate effective wavelength λgb of the second signal wave with a frequency of fo/2 is twice longer than the in-substrate effective wavelength λga of the first signal wave with a frequency of fo. Accordingly, the distance L1b is required to be twice longer than the distance L1a. The second impedance transformer 60B includes the conductive plate 25 therein. By the conductive plate 25, the waveguide of the second impedance transformer 60B is bypassed and extended to have a length of about λgb/4. An impedance transformer that handles signal waves with a long wavelength without increasing the thickness of the multilayer dielectric substrate 2 (without increasing the number of layers in the multilayer substrate) can be constituted.

Figure 8:
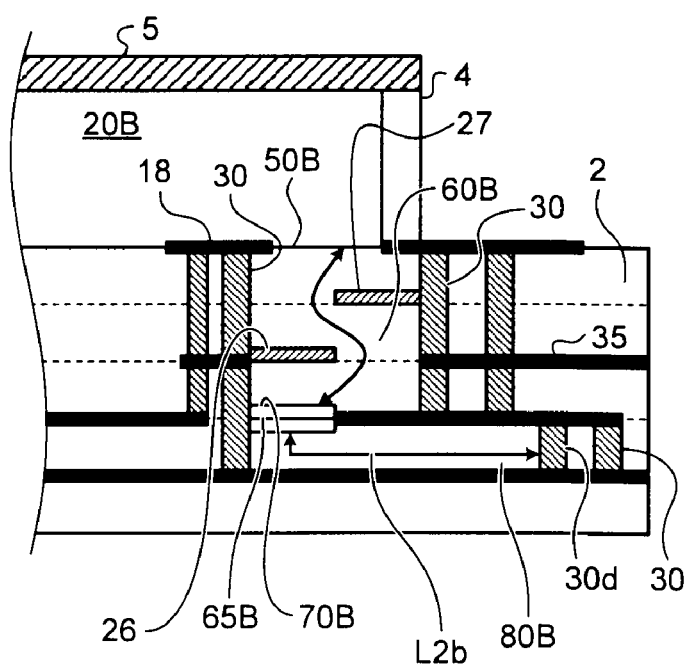
FIG. 8 is a partial enlarged cross-sectional view of a state that two conductive plates are provided alternately such that these conductive plates project in a central direction.

The conductive plate 25 is provided to bypass a signal wave propagating in the second impedance transformer 60B. Accordingly, when the conductive plate 25 is provided in the waveguide in the second impedance transformer 60B in a direction perpendicular to a direction that a signal wave travels, the signal wave can be bypassed efficiently. Further, it is efficient that the conductive plate 25 is provided to project from the side of the waveguide that the second opening 50B and the second resistor 70B are provided in a central direction. As shown in FIG. 8, when a conductive plate 26 and a conductive plate 27 are formed alternately from the opposing sides of the waveguide in the impedance transformer 60B to project in the central direction, a bypass distance can be further extended.

Figure 9:
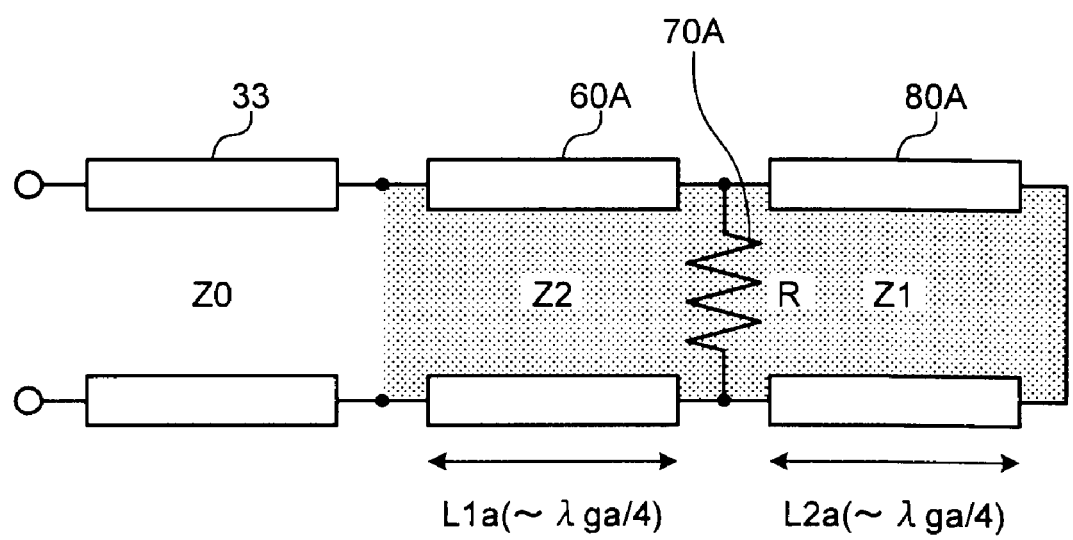
FIG. 9 depicts an equivalent circuit of a resonance suppressing circuit.

An equivalent circuit of the resonance suppressing circuit is described with reference to FIG. 9. While the first cavity-resonance suppressing circuit 20A is described, the same description can be applied to the second cavity-resonance suppressing circuit 20B. In the first cavity-resonance suppressing circuit 20A, a characteristic impedance Z2 of the first impedance transformer 60A is selected to be a value $Z2=(Z0 \cdot R)^{1/2}$ (an impedance matching value) where a characteristic impedance of the cavity 33 is denoted by Z0 and a resistance value of the first resistor 70A is denoted by R. When the impedance transformer 60A is added, reflection characteristics, that is, attenuation and absorption effects of the resistor 70A are improved as compared to a case of providing the resistor 70A directly in the opening 50A on the cavity 33 side.

Ideally, a characteristic impedance Z1 of the first dielectric transmission line 80A desirably coincides with an end impedance R of the resistor; however, it is not particularly limited thereto, because it suffices that open conditions at the first coupling aperture 65A are obtained. According to the reflection characteristics of the resonance suppressing circuit described above, a higher-order-mode reactance component is generated due to a difference in dielectric constant between the cavity 33 (the hollow waveguide) and the impedance transformer 60A (a dielectric transmission line) and thus a state of impedance matching is changed. To deal with such a change, an (inductive or capacitive) iris that cancels the reactance can be added to the inner-layer ground conductor 35 that constitutes the impedance transformer 60A. To eliminate the reactance, the characteristic impedance Z2 and the effective length L1a of the impedance transformer 60A can be corrected for improving the reflection characteristics of the entire resonance suppressing circuit.

As described above, according to the first embodiment, the impedance matching between the cavity 33 and the resistor is realized by the opening of the surface-layer ground conductor and the impedance transformer. Further, the resistor is arranged at an open point at which the electric field of a dielectric transmission line is maximized, that is, on the coupling aperture in parallel to the electric field. Consequently, in a signal frequency band, a pseudo termination condition without electric walls is formed. A resonant mode is suppressed like an open state without the cover 5. Further, two types of a resonance suppressing circuit, that is, the first cavity-resonance suppressing circuit 20A that suppresses the cavity resonance of the first signal wave with a frequency of fo and the second cavity-resonance suppressing circuit 20B that suppresses the cavity resonance of the second signal wave with a frequency of fo/2 are formed. Accordingly, resonance of signal waves of these two frequencies can be suppressed. An opening, a dielectric transmission line, and a resistor can be formed together during manufacturing of a multilayer dielectric substrate and thus secondary assembling operations are not required. That enables simplification of manufacturing steps and reductions in device costs. Moreover, because an adhesive agent is not used when the resistor is arranged, an inert gas that may corrode and contaminate a high frequency device is not generated.

The length L2a of the dielectric transmission line 80A can be set to be an odd multiple of $\lambda$ga/4 and the length L2b of the dielectric transmission line 80B can be set to be an odd multiple of $\lambda$gb/4 in the first embodiment. Similarly, the length L1a of the impedance transformer 60A can be set to be an odd multiple of $\lambda$ga/4 and the length L1b of the impedance transformer 60B can be set to be an odd multiple of $\lambda$gb/4. While the length $\lambda$ga/4 of the dielectric transmission line 80A and the length $\lambda$gb/4 of the dielectric transmission line 80B are set by the horizontal length of the multilayer dielectric substrate 2 so as to be ensured by a layer of the multilayer dielectric substrate 2 according to the first embodiment, $\lambda$ga/4 and $\lambda$gb/4 can be ensured by the length of the multilayer dielectric substrate 2 in its thickness direction.

Second Embodiment

Figure 10:
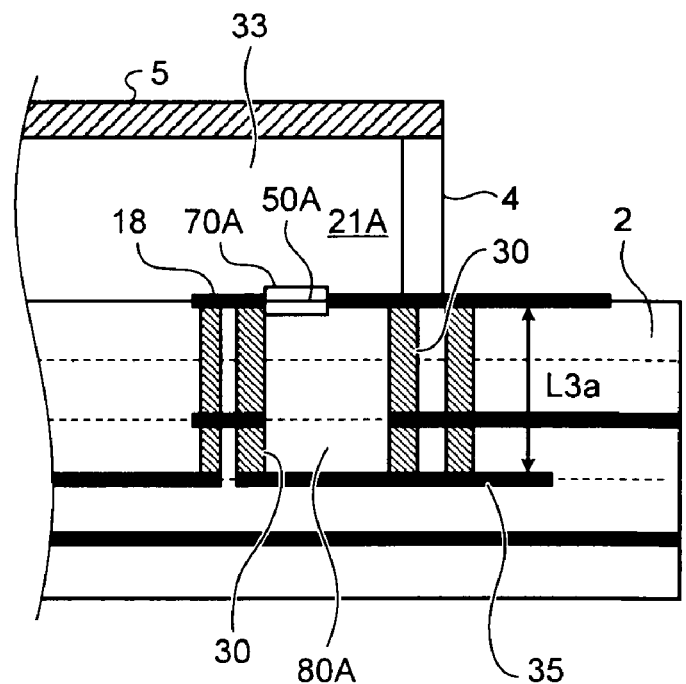
FIG. 10 is a partial enlarged cross-sectional view of an internal hierarchical structure of a multilayer dielectric substrate of a semiconductor package according to a second embodiment, particularly depicting a first cavity-resonance suppressing circuit in detail.
Figure 11:
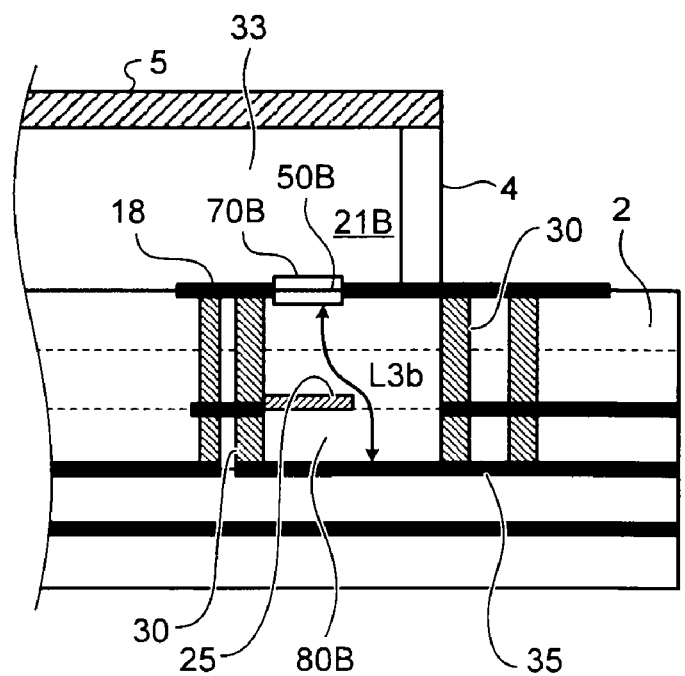
FIG. 11 is a partial enlarged cross-sectional view of an internal hierarchical structure of the multilayer dielectric substrate of the semiconductor package according to the second embodiment, particularly depicting a second cavity-resonance suppressing circuit in detail.

FIG. 10 is a partial enlarged cross-sectional view of an internal hierarchical structure of a multilayer dielectric substrate of a semiconductor package according to a second embodiment, particularly depicting a first cavity-resonance suppressing circuit in detail. FIG. 11 is a partial enlarged cross-sectional view of the internal hierarchical structure of the multilayer dielectric substrate of the semiconductor package according to the second embodiment, particularly depicting a second cavity-resonance suppressing circuit in detail. In the present embodiment, the impedance transformer according to the first embodiment is omitted.

A first cavity-resonance suppressing circuit 21A is described with reference to FIG. 10. The first opening 50A, that is, a ground open pattern is formed at or around a cavity end of a ground pattern 18 as a surface-layer ground conductor on a surface layer (a first layer) of the multilayer dielectric substrate 2. The tip-short-circuited first dielectric transmission line 80A that is electrically coupled to the cavity 33 through the opening 50A and has a length of about ¼ of in-substrate effective wavelength $\lambda$ga of a first signal wave is formed in the multilayer dielectric substrate 2 beyond the opening 50A. The first dielectric transmission line 80A is constituted by, as in the first embodiment, the inner-layer ground conductor 35, a plurality of ground vias 30, and dielectric bodies provided in the inner-layer ground conductor 35 and the ground via 30. However, in the present embodiment, a short-circuit point is formed by the inner-layer ground conductor 35. The length $\lambda$ga/4 in the first dielectric transmission line 80A is a depth (a thickness) L3a from the opening 50A to the inner-layer ground conductor 35 at the short-circuit tip. The opening 50A is placed at an open point at which an electric field is maximized and the resistor 70A is placed at the opening 50A so as to be in parallel to a surface that an electric field is formed. A pseudo termination condition without electric walls is thus formed and a resonant mode is suppressed.

A second cavity-resonance suppressing circuit 21B is described with reference to FIG. 11. The second opening 50B, that is, a ground open pattern is formed at or around the cavity end of the ground pattern 18. The tip-short-circuited second dielectric transmission line 80B with a length (L3b) of about ¼ of in-substrate effective wavelength $\lambda$gb of a second signal wave is formed in the multilayer dielectric substrate 2 beyond the opening 50B. The opening 50B is placed at the open point where an electric field is maximized and the resistor 70B is placed at the opening 50B so as to be in parallel to the surface that an electric field is formed. A pseudo termination condition without electric walls is thus formed and the resonant mode is suppressed. The second dielectric transmission line 80B includes the conductive plate 25 therein. By this conductive plate 25, a waveguide of the second dielectric transmission line 80B is bypassed and extended to have a length (L3b) of about $\lambda$gb/4. A dielectric transmission line handling signal waves with a long wavelength can be constituted without increasing the thickness of the multilayer dielectric substrate 2 (without increasing the number of layers in the multilayer substrate).

In the second embodiment with the above configuration, two types of a resonance suppressing circuit, that is, the first cavity-resonance suppressing circuit 21A that suppresses the cavity resonance of a first signal wave with a frequency of fo and the second cavity-resonance suppressing circuit 21B that suppresses the cavity resonance of a second signal wave with a frequency of fo/2 are formed. Resonance of signal waves of these two frequencies can be suppressed. Also in the present embodiment, not only the first cavity-resonance suppressing circuit 21A and the second cavity-resonance suppressing circuit 21B but also a cavity-resonance suppressing circuit that suppresses resonance of signal wave of other frequency can be provided.

Third Embodiment

Figure 12:
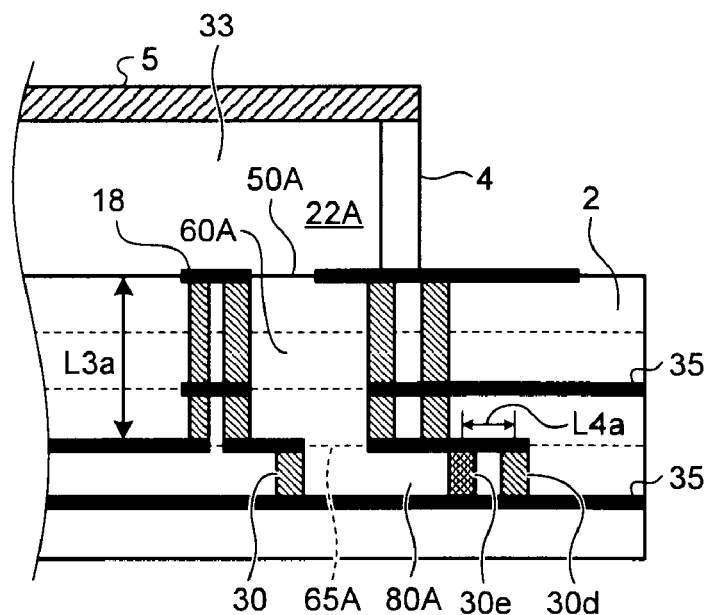
FIG. 12 is a partial enlarged cross-sectional view of an internal hierarchical structure of a multilayer dielectric substrate of a semiconductor package according to a third embodiment, particularly depicting a first cavity-resonance suppressing circuit in detail.
Figure 13:
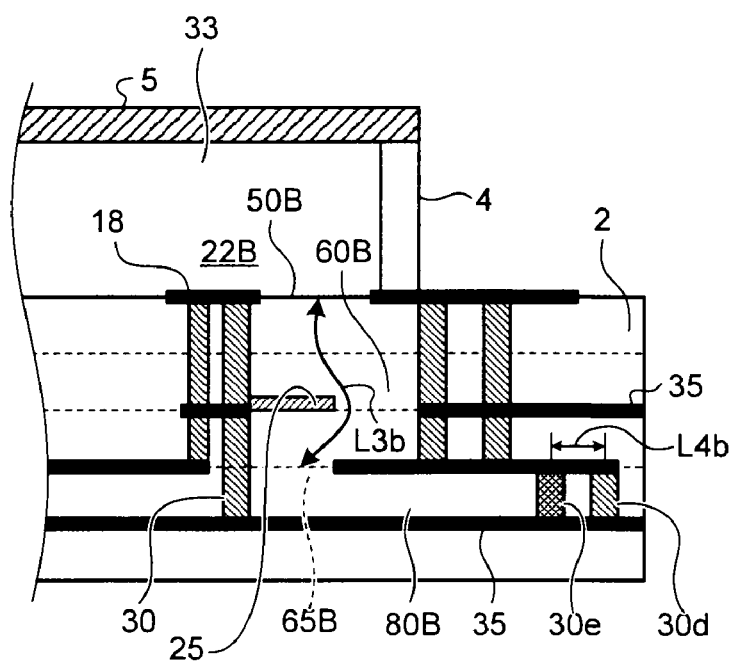
FIG. 13 is a partial enlarged cross-sectional view of an internal hierarchical structure of the multilayer dielectric substrate of the semiconductor package according to the third embodiment, particularly depicting a second cavity-resonance suppressing circuit in detail.

FIG. 12 is a partial enlarged cross-sectional view of an internal hierarchical structure of a multilayer dielectric substrate of a semiconductor package according to a third embodiment, particularly depicting a first cavity-resonance suppressing circuit in detail. FIG. 13 is a partial enlarged cross-sectional view of an internal hierarchical structure of the multilayer dielectric substrate of the semiconductor package according to the third embodiment, particularly depicting a second cavity-resonance suppressing circuit in detail.

In FIG. 12, a first cavity-resonance suppressing circuit 22A is constituted by the first opening 50A, the first impedance transformer 60A, the first coupling aperture 65A, the first dielectric transmission line 80A, and a first resistor via array 30e. That is, in the present embodiment, a resistor is placed between the tip-short-circuited ground via 30d in the dielectric transmission line 80A and the coupling aperture 65A in a direction that the dielectric substrate is laminated. Specifically, the resistor via array 30e in which the resistor is filled is arranged.

The first opening 50A, that is, a ground open pattern is formed at or around the cavity end of a ground pattern 18 as a surface-layer ground conductor on a surface layer (a first layer) of the multilayer dielectric substrate 2. The first impedance transformer 60A that is electrically connected to the cavity 33 via the opening 50A and has a length of about ¼ of in-substrate effective wavelength $\lambda$ga of a signal wave is formed in the multilayer dielectric substrate 2 beyond the opening 50A. The length about $\lambda$ga/4 in the first impedance transformer 60A is, as shown in FIG. 12, a distance L1a from the opening 50A to the coupling aperture 65A. The first impedance transformer 60A is constituted by the inner-layer ground conductor 35, a plurality of ground vias 30, and dielectric bodies in the inner-layer ground conductor 35 and the ground via 30.

The coupling aperture 65A, that is, a ground open pattern is formed in the inner-layer ground conductor 35 placed at a position apart from the opening 50A by a length of about λga/4. Further, the tip-short-circuited dielectric transmission line 80A with arbitrary length (longer than about ¼ of in-substrate effective wavelength λga of a signal wave) is formed beyond the coupling aperture 65A. The dielectric transmission line 80A is constituted by the inner-layer ground conductor 35, plural ground vias 30 and 30*d*, and dielectric bodies in the inner-layer ground conductor 35 and the ground vias 30 and 30*d*.

The resistor via array 30*e* in which a resistor is filled is provided between the ground via 30*d* that constitutes a tip short-circuit surface and the coupling aperture 65A. The resistor via array 30*e* is placed, as shown in FIG. 12, at a position in the dielectric transmission line 80A apart from the ground via 30*d* constituting the tip short-circuit surface by a length (L4*a*) of about ¼ of in-substrate effective wavelength λga of a signal wave. The position apart from a tip short-circuit point of the dielectric transmission line 80A by about λga/4 is an open point where an electric field is maximized for a signal wave with an in-substrate effective wavelength of λga. The resistor via array 30*e* is provided at this open point. The resistor via array 30*e* is placed so as to be in parallel to an electric field generated in the dielectric transmission line 80A.

In FIG. 13, a second cavity-resonance suppressing circuit 22B is constituted by the second opening 50B, the second impedance transformer 60B, the second coupling aperture 65B, the second dielectric transmission line 80B, and the resistor via array 30*e*. That is, the resistor is placed between the tip-short-circuited ground via 30*d* in the dielectric transmission line 80B and the coupling aperture 65B.

The second opening 50B, that is, a ground open pattern is formed at or around the cavity end of the ground pattern 18. The second impedance transformer 60B with a length (L3*b*) of about ¼ of in-substrate effective wavelength λgb of a second signal wave is formed in the multilayer dielectric substrate 2 beyond the opening 50B. The impedance transformer 60B includes the conductive plate 25 therein. By this conductive plate 25, the waveguide of the second dielectric transmission line 80B is bypassed and extended to have a length (L3*b*) of about λgb/4. An impedance transformer handling signal waves with a long wavelength can be constituted without increasing the thickness of the multilayer dielectric substrate 2 (without increasing the number of layers in the multilayer substrate).

According to the third embodiment with the above configuration, two types of a cavity-resonance suppressing circuit, that is, the first cavity-resonance suppressing circuit 22A that suppresses the cavity resonance of the first signal wave with a frequency of fo and the second cavity-resonance suppressing circuit 22B that suppresses the cavity resonance of the second signal wave with a frequency of fo/2 are formed. In this manner, resonance of signal waves of two target frequencies can be suppressed. Also in the present embodiment, not only the two cavity-resonance suppressing circuits but also a cavity-resonance suppressing circuit that suppresses resonance of signal wave of other frequency can be provided.

Also in the present embodiment, the impedance transformer 60A and the impedance transformer 60B can be omitted as in the second embodiment. Further, the length L4*a* from the ground via 30*d* constituting the tip short-circuit surface of the first cavity-resonance suppressing circuit 22A to the resistor via array 30*e* can be set to be a length of an odd multiple of λga/4. The length L4*b* from the ground via 30*d* constituting the tip short-circuit surface of the second cavity-resonance suppressing circuit 22B to the resistor via array 30*e* can be set to be a length of an odd multiple of λgb/4. Similarly, the length L3*a* of the first impedance transformer 60A can be set to be a length of an odd multiple of λga/4 and the length L3*b* of the second impedance transformer 60B can be set to be a length of an odd multiple of λgb/4.

While the present invention is applied to a high frequency package in which the MMIC 3B and the mixer 3A that are high frequency devices are accommodated in the IC mounting recess 6 formed in the multilayer dielectric substrate 2 in the above embodiments, the present invention can be applied to a high frequency package in which a high frequency device is mounted on a surface layer of a flat multilayer dielectric substrate 2 without the IC mounting recess 6.

Industrial Applicability

As described above, the multilayer dielectric substrate and the semiconductor package according to the present invention are useful for semiconductor electronic devices such as an FM-CW radar that needs to deal with high frequency EMI.

The invention claimed is:

1. A multilayer dielectric substrate having a cavity formed on a dielectric substrate and in which a semiconductor device is incorporated within the cavity, the multilayer dielectric substrate comprising a cavity-resonance suppressing circuit that includes:
   an opening formed in a surface-layer ground conductor arranged on the dielectric substrate within the cavity;
   an impedance transformer that is formed in the dielectric substrate, electrically connected via the opening to the cavity, and has a length of an odd multiple of about ¼ of in-substrate effective wavelength of a signal wave;
   a tip-short-circuited dielectric transmission line that is formed in the dielectric substrate and has a length of an odd multiple of about ¼ of in-substrate effective wavelength of a signal wave;
   a coupling aperture formed at a part of an inner-layer ground conductor where the impedance transformer is connected to the dielectric transmission line; and
   a resistor formed in the coupling aperture, wherein
   the multilayer dielectric substrate comprises:
   a first cavity-resonance suppressing circuit that suppresses cavity resonance of a first signal wave; and
   a second cavity-resonance suppressing circuit that suppresses cavity resonance of a second signal wave, a frequency thereof being different from that of the first signal wave.

2. The multilayer dielectric substrate according to claim 1, further comprising a conductive plate that is arranged in the dielectric substrate and bypasses a waveguide of the impedance transformer or the dielectric transmission line so that the waveguide has a length of an odd multiple of about ¼ of in-substrate effective wavelength of the signal wave.

3. The multilayer dielectric substrate according to claim 1, wherein the opening is arranged at a position on the dielectric substrate apart from a cavity side end or a side end by a length of an integer multiple of about ½ of wavelength of a signal wave.

4. The multilayer dielectric substrate according to claim 1, wherein a frequency of the first signal wave is fo and a frequency of the second signal wave is fo/2.

5. The multilayer dielectric substrate according to claim 1, wherein the dielectric transmission line is configured to include an inner-layer ground conductor, a plurality of ground vias, and dielectric bodies in the inner-layer ground conductor and the ground via.

6. A multilayer dielectric substrate having a cavity formed on a dielectric substrate and in which a semiconductor device is incorporated within the cavity, the multilayer dielectric substrate comprising a cavity-resonance suppressing circuit that includes:

an opening formed in a surface-layer ground conductor arranged on the dielectric substrate within the cavity;

an impedance transformer that is formed in the dielectric substrate, electrically connected via the opening to the cavity, and has a length of an odd multiple of about ¼ of in-substrate effective wavelength of a signal wave;

a tip-short-circuited dielectric transmission line formed in the dielectric substrate;

a coupling aperture formed at a part of an inner-layer ground conductor where the impedance transformer is connected to the dielectric transmission line; and a resistor arranged at a position within the dielectric transmission line apart from a tip short-circuit point of the dielectric transmission line by an odd multiple of about ¼ of in-substrate effective wavelength of a signal wave, wherein the multilayer dielectric substrate comprises:
a first cavity-resonance suppressing circuit that suppresses cavity resonance of a first signal wave; and
a second cavity-resonance suppressing circuit that suppresses cavity resonance of a second signal wave, a frequency thereof being different from that of the first signal wave.

7. The multilayer dielectric substrate according to claim 6, further comprising a conductive plate that is arranged in the dielectric substrate and bypasses a waveguide of the impedance transformer or the dielectric transmission line so that the waveguide has a length of an odd multiple of about ¼ of in-substrate effective wavelength of the signal wave.

8. The multilayer dielectric substrate according claim 6, wherein the opening is arranged at a position on the dielectric substrate apart from a cavity side end or a side end by a length of an integer multiple of about ½ of wavelength of a signal wave.

9. The multilayer dielectric substrate according to claim 6, wherein a frequency of the first signal wave is fo and a frequency of the second signal wave is fo/2.

10. The multilayer dielectric substrate according to claim 6, wherein the dielectric transmission line is configured to include an inner-layer ground conductor, a plurality of ground vias, and dielectric bodies in the inner-layer ground conductor and the ground via.

11. A multilayer dielectric substrate having a cavity formed on a dielectric substrate and in which a semiconductor device is incorporated within the cavity, the multilayer dielectric substrate comprising a cavity-resonance suppressing circuit that includes:
an opening formed in a surface-layer ground conductor arranged on the dielectric substrate within the cavity;
a tip-short-circuited dielectric transmission line that is formed in the dielectric substrate, electrically connected via the opening to the cavity, and has a length of an odd multiple of about ¼ of in-substrate effective wavelength of a signal wave; and
a resistor formed in the opening, wherein
the multilayer dielectric substrate comprises:
a first cavity-resonance suppressing circuit that suppresses cavity resonance of a first signal wave; and
a second cavity-resonance suppressing circuit that suppresses cavity resonance of a second signal wave, a frequency thereof being different from that of the first signal wave.

12. The multilayer dielectric substrate according to claim 11, further comprising a conductive plate that is arranged in the dielectric substrate and bypasses a waveguide of the impedance transformer or the dielectric transmission line so that the waveguide has a length of an odd multiple of about ¼ of in-substrate effective wavelength of the signal wave.

13. The multilayer dielectric substrate according to claim 11, wherein the opening is arranged at a position on the dielectric substrate apart from a cavity side end or a side end by a length of an integer multiple of about ½ of wavelength of a signal wave.

14. The multilayer dielectric substrate according to claim 11, wherein a frequency of the first signal wave is fo and a frequency of the second signal wave is fo/2.

15. The multilayer dielectric substrate according to claim 11, wherein the dielectric transmission line is configured to include an inner-layer ground conductor, a plurality of ground vias, and dielectric bodies in the inner-layer ground conductor and the ground via.

16. A multilayer dielectric substrate having a cavity formed on a dielectric substrate and in which a semiconductor device is incorporated within the cavity, the multilayer dielectric substrate comprising a cavity-resonance suppressing circuit that includes:
an opening formed in a surface-layer ground conductor arranged on the dielectric substrate within the cavity;
a tip-short-circuited dielectric transmission line that is formed in the dielectric substrate and electrically connected via the opening to the cavity; and
a resistor arranged at a position in the dielectric transmission line apart from a tip short-circuit point of the dielectric transmission line by an odd multiple of about ¼ of in-substrate effective wavelength of a signal wave, wherein
the multilayer dielectric substrate comprises:
a first cavity-resonance suppressing circuit that suppresses cavity resonance of a first signal wave; and
a second cavity-resonance suppressing circuit that suppresses cavity resonance of a second signal wave, a frequency thereof being different from that of the first signal wave.

17. The multilayer dielectric substrate according to claim 16, further comprising a conductive plate that is arranged in the dielectric substrate and bypasses a waveguide of the dielectric transmission line so that a distance from the tip short-circuit point to the resistor has a length of an odd multiple of about ¼ of in-substrate effective wavelength of a signal wave.

18. The multilayer dielectric substrate according to claim 16, wherein the opening is arranged at a position on the dielectric substrate apart from a cavity side end or a side end by a length of an integer multiple of about ½ of wavelength of a signal wave.

19. The multilayer dielectric substrate according to claim 16, wherein a frequency of the first signal wave is fo and a frequency of the second signal wave is fo/2.

20. The multilayer dielectric substrate according to claim 16, wherein the dielectric transmission line is configured to include an inner-layer ground conductor, a plurality of ground vias, and dielectric bodies in the inner-layer ground conductor and the ground via.

* * * * *